US009081438B2

United States Patent
Yeh et al.

(10) Patent No.: US 9,081,438 B2
(45) Date of Patent: Jul. 14, 2015

(54) CAPACITIVE TOUCH PANEL CONTROLLER AND METHOD OF MANUFACTURING THE SAME

(71) Applicant: ELAN MICROELECTRONICS CORPORATION, Hsin Chu (TW)

(72) Inventors: I-Hau Yeh, Taipei (TW); Tsun-Min Wang, Zhunan Township, Miaoli County (TW); Chun-Chung Huang, Hsinchu (TW)

(73) Assignee: Elan Microelectronics Corporation, Hsin Chu (TW)

( * ) Notice: Subject to any disclaimer, the term of this patent is extended or adjusted under 35 U.S.C. 154(b) by 185 days.

(21) Appl. No.: 13/738,167

(22) Filed: Jan. 10, 2013

(65) Prior Publication Data

US 2013/0265277 A1 Oct. 10, 2013

(30) Foreign Application Priority Data

Feb. 24, 2012 (TW) ............... 101106195 A
Sep. 24, 2012 (TW) ............... 101134891 A

(51) Int. Cl.
*G06F 3/044* (2006.01)
*G06F 3/041* (2006.01)
*H01L 29/66* (2006.01)

(52) U.S. Cl.
CPC ............ *G06F 3/0416* (2013.01); *G06F 3/044* (2013.01); *H01L 29/66007* (2013.01)

(58) Field of Classification Search
CPC ... G06F 3/044; H01L 29/66007; G11C 5/145; H02M 3/07; H03K 19/00
USPC .................. 345/173–174; 327/148
See application file for complete search history.

(56) References Cited

U.S. PATENT DOCUMENTS

| 6,177,830 B1 * | 1/2001 | Rao ............................. 327/536 |
| 7,271,626 B1 * | 9/2007 | Burinskiy et al. ............ 327/108 |
| 2010/0060593 A1 * | 3/2010 | Krah ............................ 345/173 |

* cited by examiner

*Primary Examiner* — Christopher E Leiby
(74) *Attorney, Agent, or Firm* — Muncy, Geissler, Olds & Lowe, P.C.

(57) ABSTRACT

A capacitive touch panel controller has a memory and multiple driving signal output units. At least one transistor of each driving signal output unit and multiple transistors of the memory are fabricated by an identical semiconductor fabrication process so that the gate oxide layers of the transistors of the driving signal output unit and the memory are identical in thickness. As the transistor of each driving signal output unit and those of the memory are fabricated by a same high-voltage semiconductor fabrication process, the transistor of each driving signal output unit can be fabricated to provide a capacitive touch panel controller having high-voltage driving capability without using any high-voltage fabrication process and increasing the production cost. Due to the high-voltage driving, the SNR and anti-interference capability can be increased.

51 Claims, 13 Drawing Sheets

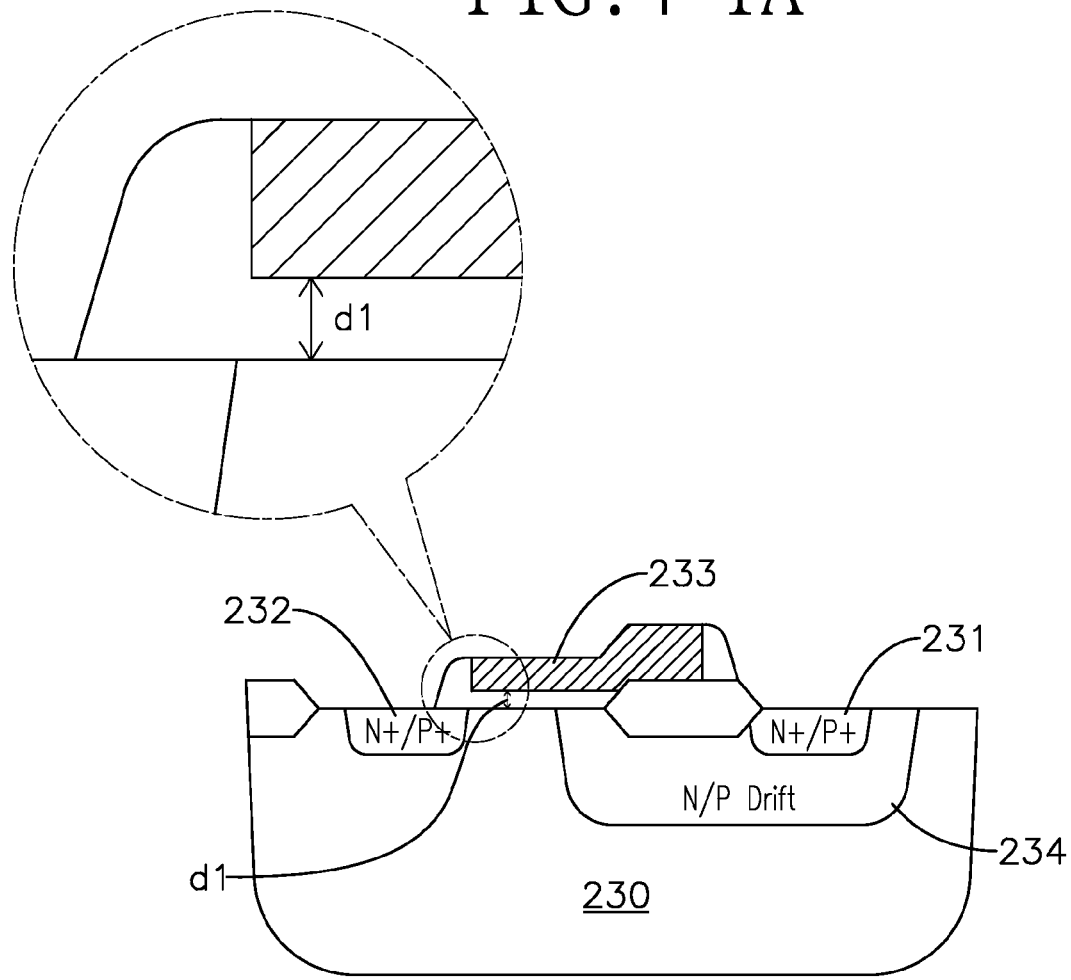

CAPACITIVE TOUCH PANEL CONTROLLER AND METHOD OF MANUFACTURING THE SAME

BACKGROUND OF THE INVENTION

1. Field of the Invention

The present invention relates to a touch panel controller and manufacturing method thereof and more particularly to a capacitive touch panel controller having high voltage driving capability and manufactured by a process manufacturing a programmable non-volatile memory and a method manufacturing the same.

2. Description of the Related Art

After the world is overwhelmed by smart phones and tablet personal computers (PC), touch panels have become the most popular user interface. Among various types of touch panels, capacitive touch panels supporting multiple touches are the ones getting special attention and gradually promote the widespread penetration of large-size touch panels. Current capacitive touch panels are classified as mutual-capacitance touch panels and self-capacitance touch panels, and their difference lies in operation of the controllers mounted thereon. Under the circumstance of expanded application scope, increasingly complicated environment in operation and cost reduction, touch panel controllers must confront high-noise environment everywhere. Hence, how to suppress noise becomes one of the most critical subjects in developing the integrated circuits (IC) of touch panel controllers.

With reference to FIG. 9, a conventional capacitive touch panel controller has a MCU 71, a non-volatile memory 72, a capacitive detection circuit 73 and a functional circuit 74 (such as power on reset (POR), internal RC oscillator (IRC OSC), low voltage detection (LVD), static random access memory (SRAM)). The capacitive detection circuit 73 is connected to X-axis traces and Y-axis traces of the capacitive touch pane. If the conventional capacitive touch panel is a mutual-capacitance touch panel, the capacitive detection circuit 73 transmits a driving signal to each X-axis trace and each Y-axis trace serves to receive a sensing signal. If the conventional capacitive touch panel is a self-capacitance touch panel, the capacitive detection circuit 73 transmits a driving signal to one of the traces and the same trace receives a sensing signal. The signals transmitted from the capacitive detection circuit 73 to each trace is controlled by a transmission circuit composed of multiple transistors.

When the signals transmitted from the transmission circuit have a regular voltage, such as 3.3V±10% or 5.5V±10%, the signal-to-noise ratio (SNR) of the signals become worse when noise intensity received by each trace of the touch panel is higher because SNR is limited by an operating voltage. If the signals transmitted from the transmission circuit have a relatively high voltage, the SNR of the high-voltage signals is higher than the SNR of the signals having regular voltage. Ideally, the voltage used by the high-voltage transmission circuit is N times larger than the voltage used by the transmission circuit having regular voltage, and the SNR of the high-voltage transmission circuit is naturally N times larger than that of the transmission circuit having regular voltage. From the foregoing, if the transmission circuit of the controller transmits signals with higher voltage, noise withstanding capability of the controller and the SNR of received signals can be enhanced. The capacitive detection circuit 73 adopts the following approaches to transmit signals with higher voltage.

1. External Boost IC

With reference to FIG. 10, one of the approaches for increasing voltage of signals transmitted from the controller is to connect a boost IC 75 to an output terminal of the transmission circuit of the capacitive detection circuit 73 so that signals transmitted from the transmission circuit increase their voltage levels after passing through the boost IC 75 and are further transmitted to the traces of the touch panel. Although such approach certainly boosts the voltage level of the signals transmitted from the transmission circuit, the approach requiring an additional boost IC 75 is not optimal no matter if the size or the cost is concerned.

2. Add High-Voltage Element in the Controller or Fabricate the Controller IC Using High-Voltage Process Technology.

Since the controller IC contains a non-volatile memory, problems arising from process integration must be taken into account when the processes manufacturing the controller IC are selected. However, as far as current process technology of non-volatile memory is concerned, if a high-voltage process manufacturing a high-voltage element is integrated in a non-volatile memory process, several mask processes and photo-lithography processes in the high-voltage process. With reference to FIG. 11, a high-voltage transistor 76 fabricated with a standard high-voltage process is shown. As can be seen in FIG. 11, in contrast to elements using regular voltage, the high-voltage transistor requires a drain/source drift (D/S Drift) area and a P/NMOS voltage threshold (P/NMOS Vt) and the like to adjust a drain/source implant concentration and a threshold voltage of MOS.

Hence, if the high-voltage transistor is also fabricated during the manufacturing process of the non-volatile memory, the high-voltage process should be added in the current non-volatile memory process. To tackle the addition, not only four to seven additional masks and lithography processes should be added, but also the manufacturing cost inevitably builds up because the logic of masking operation and the complementary logic may not allow the non-volatile memory and the high-voltage element to commonly use the N/P Drift, HV P/NMOS Vt and the like.

From the foregoing, the approach using an additional boost IC to increase the voltage of the transmitted signals is hardly feasible because of the size and cost concern. The approach adding high-voltage transistor in the process manufacturing a non-volatile memory causes cost buildup for the sake of more mask processes and photo-lithography processes required, and the high-voltage transistor and the non-volatile memory may not be jointly operated due to the problem on the logic of masking operation and the complementary logic. However, to increase the SNR of the transmitted signals, a high-voltage driving approach is a must. A feasible technical solution with the manufacturing process efficiency, cost, and higher SNR and anti-interference capability taken into account needs to be further addressed.

SUMMARY OF THE INVENTION

A first objective of the present invention is to provide a capacitive touch panel controller capable of providing high-voltage driving capability and further enhancing the signal to noise ratio (SNR) of signals inputted to the controller and anti-interference capability under the premise of no use of high-voltage manufacturing process and no manufacturing cost buildup.

To achieve the foregoing objective, the capacitive touch panel controller having high-voltage driving capability has a memory and multiple driving signal output units. The memory has multiple transistors and each driving signal output unit has at least one transistor. The at least one transistor of each driving signal output unit and the transistors of the memory are fabricated by an identical semiconductor fabrication process. Each one of the at least one transistor has a gate oxide layer identical to that of the multiple transistors of the memory in thickness.

Preferably, the semiconductor fabrication process is a programmable non-volatile memory fabrication process capable of simultaneously fabricating the programmable non-volatile memory and the driving signal output units.

Alternatively, to achieve the foregoing objective, the capacitive touch panel controller has a micro-controller unit (MCU), a programmable non-volatile memory and a driving and detection circuit.

The programmable non-volatile memory is connected to the MCU and has multiple transistors.

The driving and detection circuit is connected to the MCU and has a high-voltage transmission circuit and a receiving circuit.

The high-voltage transmission circuit has at least one input terminal, multiple output terminals and multiple driving signal output units.

The at least one input terminal is controlled by the MCU to transmit a signal.

Each driving signal output unit is connected to one of the output terminals and has at least one transistor. The at least one transistor of each driving signal output unit and the transistors of the programmable non-volatile memory are fabricated by an identical programmable non-volatile memory fabrication process. Each one of the at least one transistor of the driving signal output unit has a gate oxide layer identical to that of the transistors of the programmable non-volatile memory in thickness.

The receiving circuit has multiple input terminals and at least one output terminal. Each input terminal is adapted to receive a sensing signal from a touch panel. The at least one output terminal is connected to the MCU.

The multiple driving signal output units of the high-voltage transmission circuit of the driving and detection circuit and the memory in the foregoing capacitive touch panel controller can be fabricated by an identical semiconductor fabrication process so that the transistors of the driving signal output units become high-voltage transistors having the withstanding capability and reliability against high voltage and each driving signal output unit therefore becomes a high-voltage element. Accordingly, the capacitive touch panel controller of the present invention does not require additional four to seven mask and photo-lithograph fabrication processes, and the high-voltage transistors of the driving signal output units can be fabricated by an identical semiconductor fabrication process manufacturing the memory in the capacitive touch panel controller. The capacitive touch panel controller having high-voltage driving capability can be provided under the premise of no use of high-voltage manufacturing process and no manufacturing cost buildup because the touch panel can output high-voltage driving signals capable of enhancing SNR value and anti-interference capability of signals inputted to the controller.

Other objectives, advantages and novel features of the invention will become more apparent from the following detailed description when taken in conjunction with the accompanying drawings.

BRIEF DESCRIPTION OF THE DRAWINGS

FIG. 4-1 is a cross-sectional view of an embodiment of a transistor in the driving and detection circuit in FIG. 2;

FIG. 4-1A is an enlarged cross-sectional view of the transistor in FIG. 4-1;

FIG. 4-2 is a cross-sectional view of another embodiment of the transistor in the driving and detection circuit in FIG. 2;

FIG. 4-2A is an enlarged cross-sectional view of the transistor in FIG. 4-2;

DETAILED DESCRIPTION OF THE INVENTION

Figure 1:
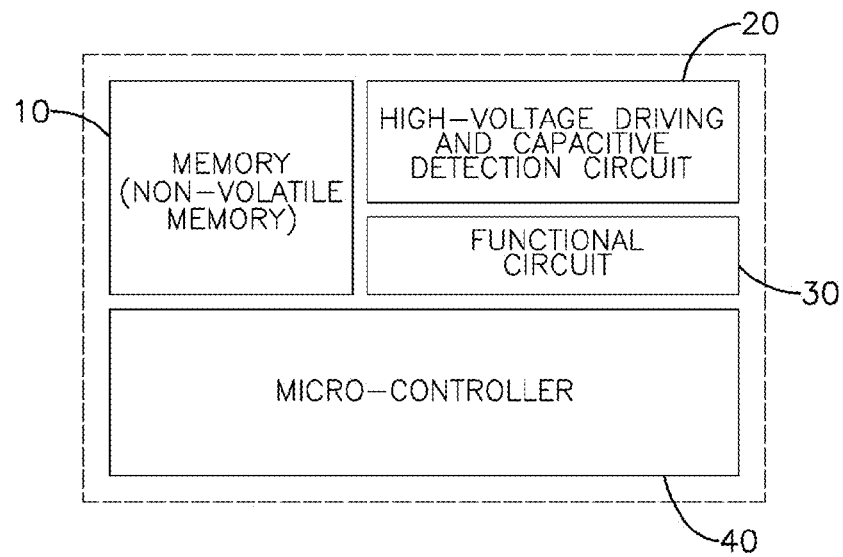
FIG. 1 is a functional block diagram of a capacitive touch panel controller having high voltage driving capability in accordance with the present invention.

With reference to FIG. 1, a capacitive touch panel controller having high voltage driving capability in accordance with the present invention has a memory, a driving and detection circuit, a functional circuit 30 and a micro-controller unit (MCU) 40.

The MCU 40 is connected to the memory, the driving and detection circuit and the functional circuit 30. The memory may be a programmable non-volatile memory 10, such as a flash memory or an erasable programmable read only memory (EEPROM). The driving and detection circuit may be a high-voltage driving and capacitive detection circuit 20. The functional module 30 includes but not limited to POR, IRC OSC, LVD, SRAM and the like.

Figure 2:
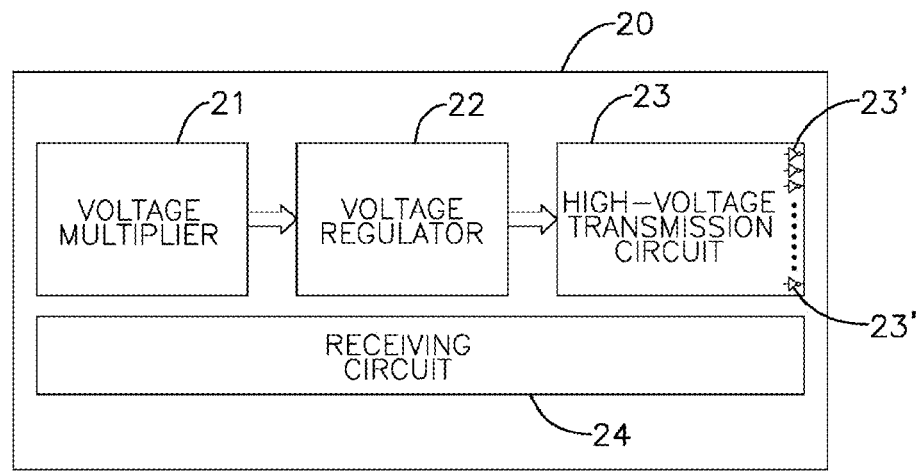
FIG. 2 is a functional block diagram of a first embodiment of a driving and detection circuit of the touch panel controller in FIG. 1.

With reference to FIG. 2, in regular, the driving and detection circuit has a high-voltage transmission circuit 23 and a receiving circuit 24. The high-voltage driving and capacitive detection circuit 20 further has a voltage multiplier 21 and a voltage regulator 22.

Figure 3A:
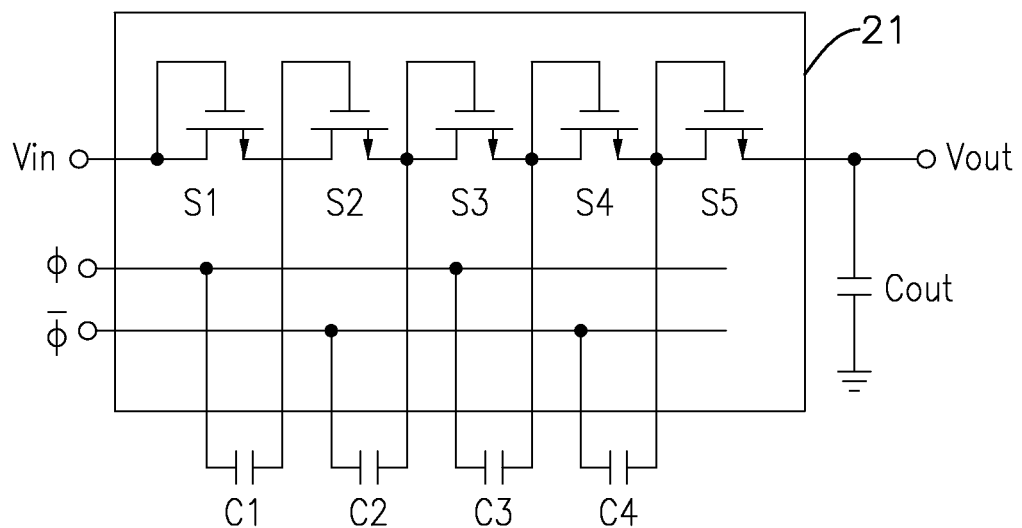
FIG. 3A is a circuit diagram of an embodiment of a voltage multiplier of the driving and detection circuit in FIG. 2.
Figure 3B:
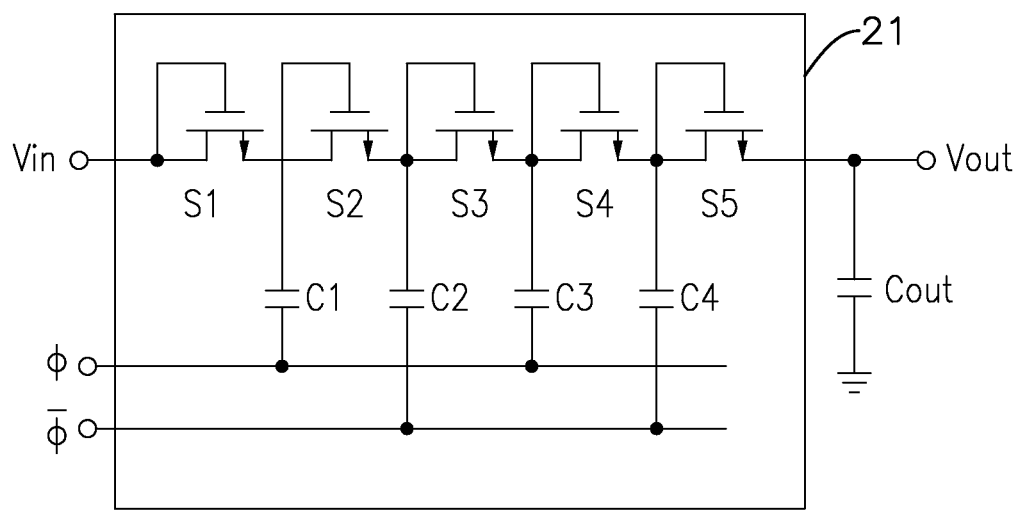
FIG. 3B is a circuit diagram of another embodiment of the voltage multiplier in FIG. 3A.

The voltage multiplier 21 serves to double a normal operating voltage in generation of a relatively higher voltage. In the present embodiment, preferably, the relatively higher voltage includes but not limited to in a range of 8V to 12V, and the voltage multiplier 21 is a charge pump. With reference to FIG. 3A, the voltage multiplier 21 has multiple transistors S1 to S5, multiple capacitors C1 to C4 and an output capacitor Cout. Each transistor S1 to S5 serves to control a phase of a terminal voltage of a corresponding capacitor C1 to C4. When the phase of the terminal voltage of the capacitor C1 to C4 is inverted, the terminal voltage increase as a result of the instantaneous phase change, thereby doubling the terminal voltage. In the present embodiment, the capacitors C1 to C4 are external to the voltage multiplier 21. Hence, discrete capacitors having better high-voltage withstanding property are employed to result in a satisfactory efficiency of the charge pump. However, the drawback of using discrete capacitors lies in that the controller needs to provide pins required by the external capacitors. With reference to FIG. 3B, the capacitors C1 to C4 of the voltage multiplier 21 are built in the voltage multiplier 21. There is no need for the controller to add the pins required by external capacitors. However, based on cost concern, capacitors with large capacity are usually inapplicable. To cope with the foregoing problems, the following feasible solutions are provided.

1. Increase a time for transferring charge in the charge pump to afford a load current loss.

2. Use a non-overlapping clock signal to control the switches S1 to S5 of the charge pump so as to avoid generation of DC paths and unnecessary power loss.

In addition to be entirely built in or external to the voltage multiplier 21, the capacitors C1 to C4 of the voltage multiplier 21 may be partially built in with the remaining capacitors external to the voltage multiplier 21.

The voltage regulator 22 has an input terminal and an output terminal. The input terminal is connected to a voltage multiplier 21 for the voltage regulator 22 to regulate a relatively high voltage outputted from the voltage multiplier 21 and provide a stable voltage.

The high-voltage transmission circuit 23 of the high-voltage driving and capacitive detection circuit 20 has at least one input terminal and multiple output terminals. The at least one input terminal is connected to the output terminal of the voltage regulator 22 and is controlled by the MCU 40 to transmit signals. Each output terminal is connected to a driving signal output unit 23' and serves to be connected to a scanning line of a touch panel. The driving signal output unit 23' of the high-voltage transmission circuit 23 and the memory 10 are completed in a same semiconductor fabrication process. Hence, the transistors of each driving signal output unit 23' and each memory 10 have an identical thickness of the gate oxide (GDX) layer. With reference to FIGS. 4-1, 4-1A, 4-2 and 4-2B, the thickness of the GDX layer is a distance dl from a bottom surface of the gate to a top surface of the substrate. Moreover, the transistors in the voltage multiplier 21 may also be fabricated in the same semiconductor fabrication process so that the thickness of the GDX layer of the transistors in the voltage multiplier 21 is identical to that of the transistors in the driving signal output unit 23' and the memory 10.

Figure 3C:
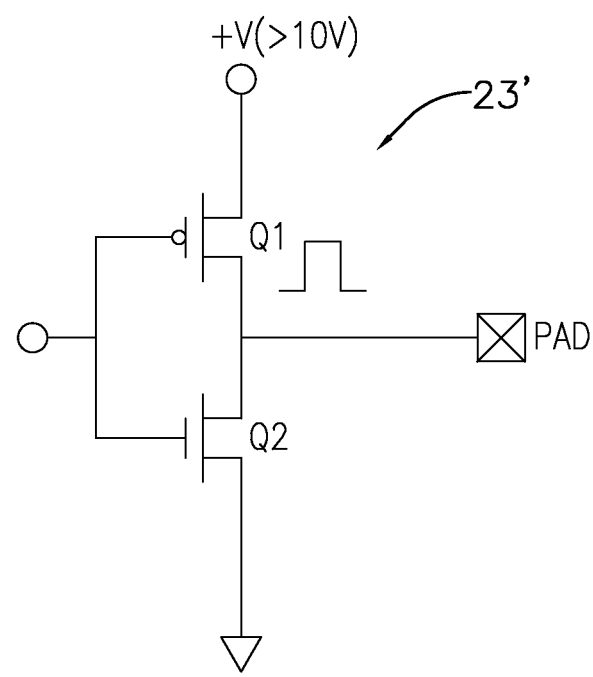
FIG. 3C is a circuit diagram of a driving signal output unit in accordance with the present invention.

With reference to FIG. 3C, each driving signal output unit 23' may be an inverter formed by at least two transistors Q1, Q2 connected in series. Given an upper PMOSFET Q1 and a lower NMOSFET Q2 as an example, the PMOSFET Q1 connected to a high voltage +V of the inverter is made by a semiconductor fabrication process to become a high-voltage transistor capable of withstanding a voltage with at least 10V as the present invention increases the voltage for transmitting a driving signal. Preferably, all the transistors Q1, Q2 of the inverter are high-voltage transistors. If the present invention employs a programmable non-volatile memory, the mentioned semiconductor fabrication process is a fabrication process of the programmable non-volatile memory.

The driving signal voltage outputted by the regular-voltage sensors used by current capacitive touch panels is approximately 3.3V or 5V, and the SNR value is therefore low. For a touch panel used in a large-scale tablet personal computer, the driving signal voltage needs to at least increase up to 30V to acquire a satisfactory SNR value. On the other hand, for a touch panel with a more compact size used in a mobile phone, to achieve an identical SNR value, the driving signal voltage just needs to be controlled at about 10V and up. Hence, the transistors of the driving signal output unit 23' for the sensors of the present invention together with the programmable non-volatile memory of the sensors can be jointly produced by a same fabrication process of a programmable non-volatile memory so that the high-voltage transistors of the driving signal output units 23' have a 10V withstanding voltage and the voltage of the driving signals is increased to at least 10V to obtain a more satisfactory SNR value.

Figures 2, 4:
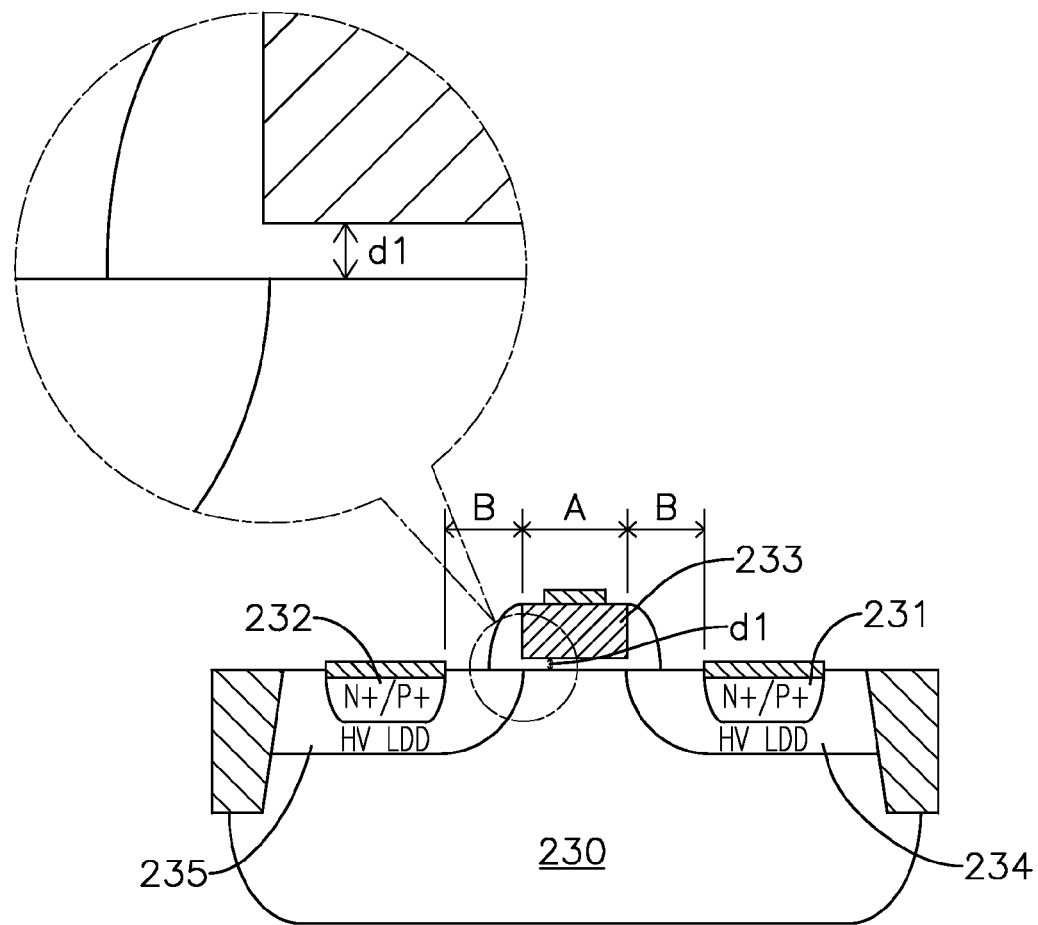

With reference to FIGS. 4-1 and 4-1A, each transistor has a substrate 230, a drain implant area 231, a source implant area 232 and a gate 233. The drain implant area 231, the source implant area 232 and the gate 233 are formed on the substrate 230. The gate 233 may be a metal layer or a polysilicon layer or another transistor as shown in FIGS. 4-2 and 4-2A, that is, lightly doped drains (LDD) 234, 235 respectively formed on bottoms of the drain implant area 231 and the source implant area 232. To ensure better withstanding capability and reliability of the transistors against high voltage, the following three semiconductor structure properties are adjusted in the fabrication process of the programmable non-volatile memory.

1. Increase the channel length (A);

2. Increase distances from the polysilicon layer to the drain implant area 231 and to the source implant area 232.

3. Reduce the doping concentration of the LDDs 234, 235 on the bottoms of the drain implant area 231 and the source implant area 232.

The adjustment of the aforementioned three semiconductor structure properties can be done by just changing the layout pattern in the integrated circuit layout design or slightly adjusting the doping concentration. The high-voltage transistor can be fabricated by the fabrication process of the programmable non-volatile memory without increasing additional lithography processes. Hence, the operating saturation current of the high-voltage transistor can be lowered so that a damage caused by a hot carrier injection (HCI) effect against the gate 233 can be reduced and the life cycle of the high-voltage transistor can be relatively prolonged.

With further reference to FIG. 2, the receiving circuit 24 has multiple input terminals and at least one output terminal. Each input terminal receives a sensing signal from a touch panel. The at least one output terminal is connected to the MCU 40. The receiving circuit 24 is operated at a normal voltage.

While operated under a mutual-capacitance sensing mode, the high-voltage transmission circuit 23 is connected to each X-axis trace of the touch panel to transmit signals to each X-axis trace. The receiving circuit 24 is connected to each Y-axis trace of the touch panel to receive to receive sensing signals through each Y-axis trace. As the signals transmitted by the high-voltage transmission circuit 23 to each X-axis trace has a high voltage whose voltage value can be few times larger than a regular voltage, the SNR of the transmitted signals can be few times greater than that of signals with a regular voltage. Also because the signals from the X-axis traces are transmitted to the respective Y-axis traces by capacitance coupling, the sensing signals on the Y-axis traces do not have a high voltage value. When the sensing signals are received by the receiving circuit 24, the receiving circuit 24 operated at a regular voltage can be relieved from the impact of high voltage.

Figure 5A:
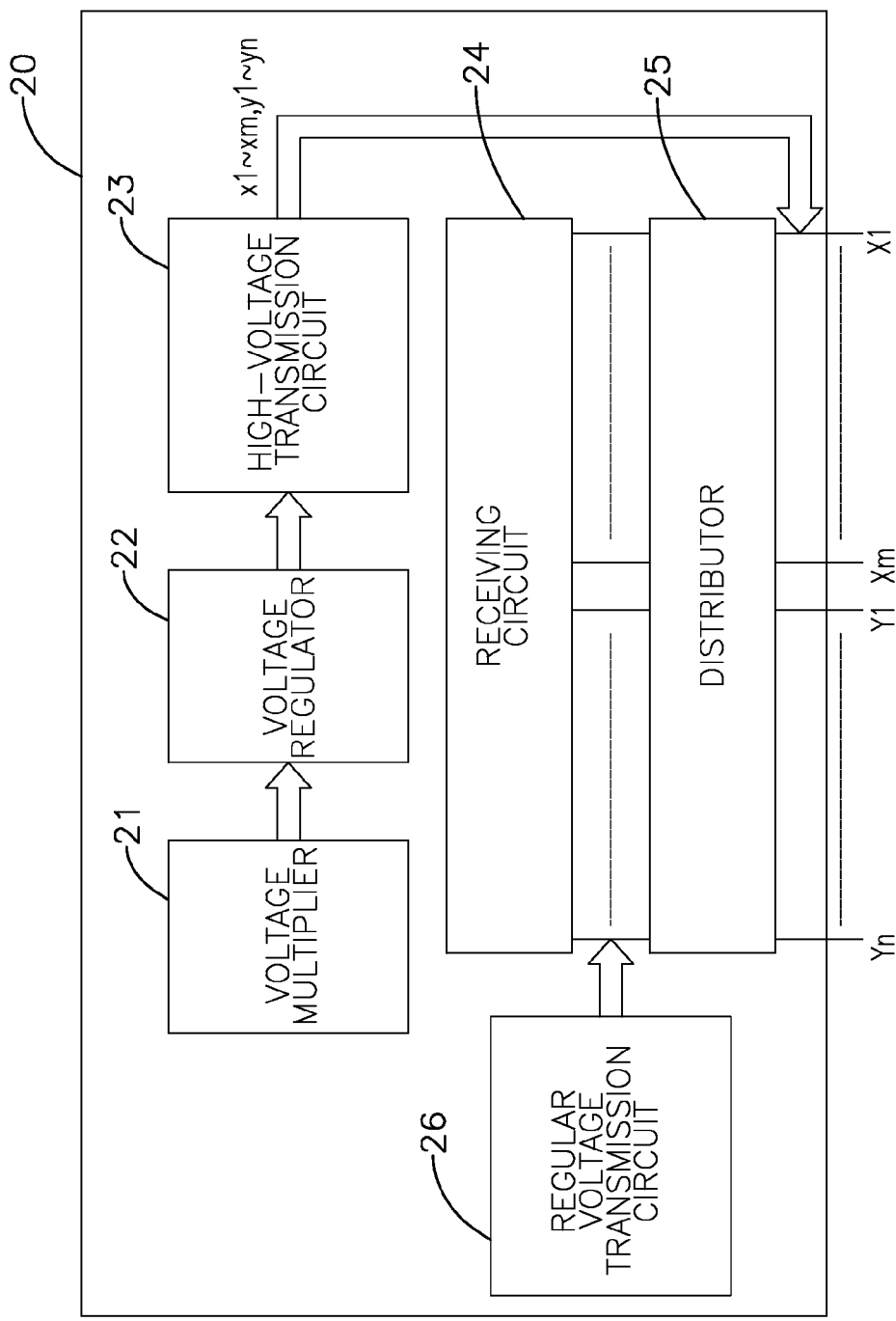
FIG. 5A is a functional block diagram of a second embodiment of a driving and detection circuit of the touch panel controller in FIG. 1.
Figure 5B:
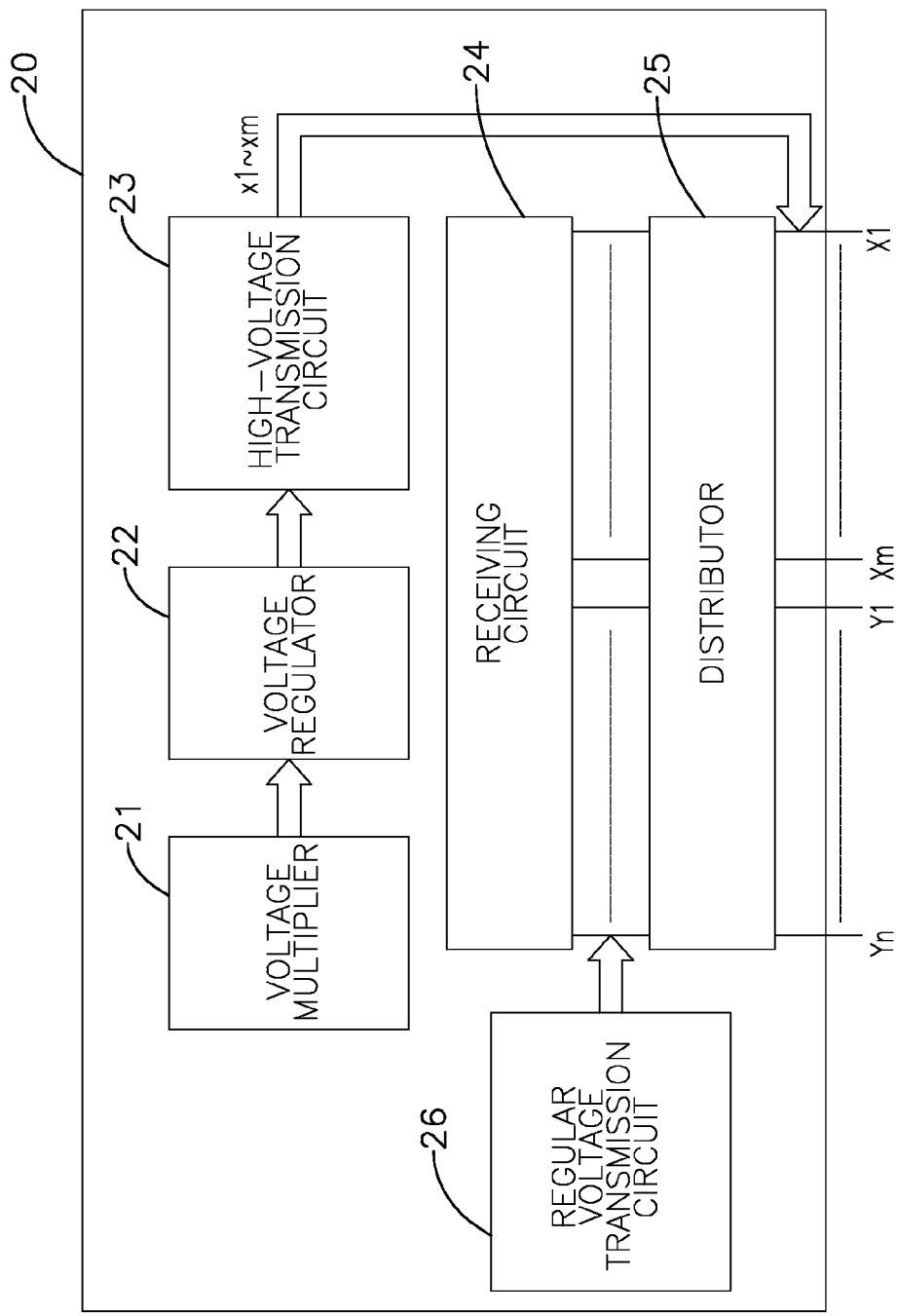
FIG. 5B is a functional block diagram of a third embodiment of a driving and detection circuit of the touch panel controller in FIG. 1.

With reference to FIG. 5A, a second embodiment of a driving and detection circuit 20 in accordance with the present invention is roughly the same as the first embodiment thereof except that the driving and detection circuit 20 in the present embodiment further has a distributor 25 and a regular voltage transmission circuit 26. The distributor 25 is controlled by the MCU 40, is connected to each input terminal of the receiving circuit 24, and has multiple X-axis sensing pins X1 to Xm and multiple Y-axis sensing pins Y1 to Yn. The output terminals x1 to xm and y1 to yn of the high-voltage transmission circuit 23 respectively correspond to the X-axis sensing pins X1 to Xm and the Y-axis sensing pins Y1 to Yn of the distributor 25. In other words, the output terminals x1 to xm of the high-voltage transmission circuit 23 are respectively connected to the X-axis sensing pins X1 to Xm of the distributor 25, and the output terminals y1 to yn are respectively connected to the Y-axis sensing pins Y1 to Yn of the distributor 25. With reference to FIG. 5B, a third embodiment of a driving and detection circuit 20 in accordance with the present invention is shown. The high-voltage transmission circuit 23 only has multiple output terminals x1 to xm or y1 to yn. If the high-voltage transmission circuit 23 only has multiple output terminals x1 to xm, the output terminals x1 to xm are respectively connected to the X-axis sensing pins X1 to Xm of the distributor 25. Otherwise, if the high-voltage transmission circuit 23 only has multiple output terminals y1 to yn, the output terminals y1 to yn are respectively connected to the Y-axis sensing pins Y1 to Yn of the distributor 25.

When the foregoing embodiments are operated, the X-axis sensing pins X1 to Xm and the Y-axis sensing pins Y1 to Yn of the distributor 25 of the driving and detection circuit 20 are respectively connected to the X-axis traces and the Y-axis traces of the touch panel.

Figure 6:
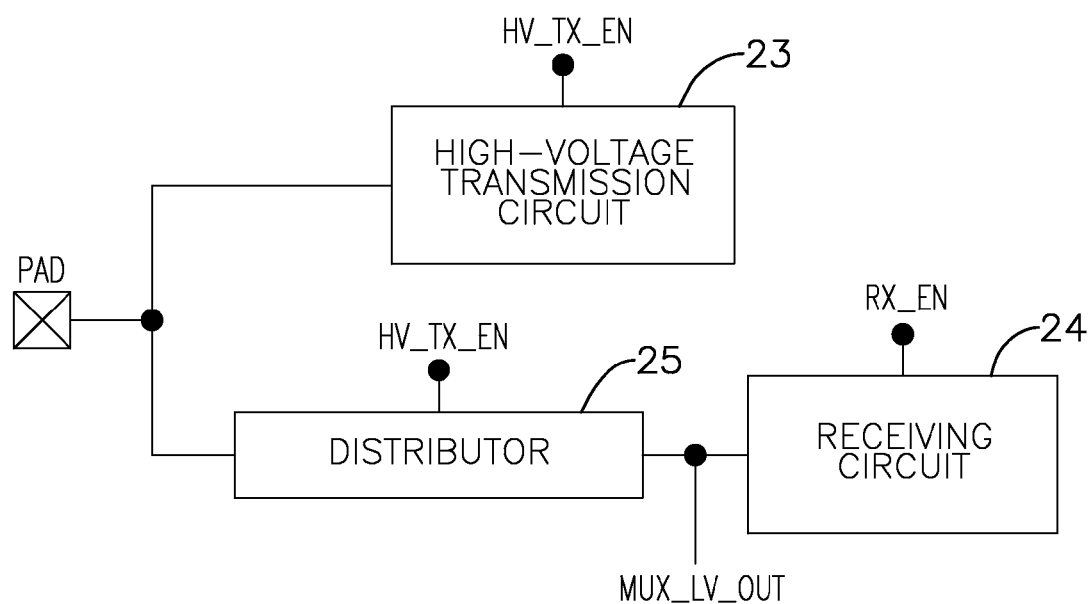
FIG. 6 is a schematic view showing a control relationship of the driving and detection circuit in FIG. 5A.

While operated under a self-capacitance sensing mode, to ensure that the receiving circuit 24 operated under a normal voltage is immune to the direct impact of high-voltage signals transmitted from the high-voltage transmission circuit 23, the distributor 25 can be used for appropriate signal isolation. With reference to FIG. 6, a control relationship of the driving and detection circuit is shown. One of the output terminals of the high-voltage transmission circuit 23 is connected to a trace connection point (PAD). The trace connection point (PAD) is also connected to one of the input pins of the distributor 25. One output pin of the distributor 25 is connected to one of the input terminals of the receiving circuit 24. The high-voltage transmission circuit 23, the receiving circuit 24 and the distributor 25 are respectively controlled by the enable signals HV_TX_EN and RX_EN sent out by the MCU 40.

When the MCU 40 sends out the enable signal HV-TX_EN, the high-voltage transmission circuit 23 is enabled to transmit a high-voltage signal to a corresponding trace through the corresponding PAD and the distributor 25 is also enabled to block the high-voltage signal transmitted from the PAD. In other words, when the MCU 40 sends out an enable signal HV_TX_EN to the high-voltage transmission circuit 23 and to the distributor 25, the MCU 40 is suspended from sending the enable signal RX-EN to the receiving circuit 24. Therefore, the distributor 25 can filter the high-voltage signals outputted from the high-voltage transmission circuit 23 to prevent the high-voltage signals from fed back to the receiving circuit 24. After having been operating for a while, the MCU 40 no longer sends out the enable signal HV_TX_EN to the high-voltage transmission circuit 23 and the distributor 25. Meanwhile, the output pins of the distributor 25 are connected to the corresponding PADs so that the receiving circuit 24 can receive low-voltage sensing signals from the PADs after receiving the enable signal RX_EN.

While operated under the self-capacitance sensing mode, the regular voltage transmission circuit 26 respectively transmits signals having regular voltage to the X-axis traces and the Y-axis traces of the touch panel through the input terminals of the receiving circuit 24 and the corresponding pins of the distributor 25 for the receiving circuit 24 to receive the sensing signals of the X-axis traces and the Y-axis traces through the distributor 25.

Figure 7A:
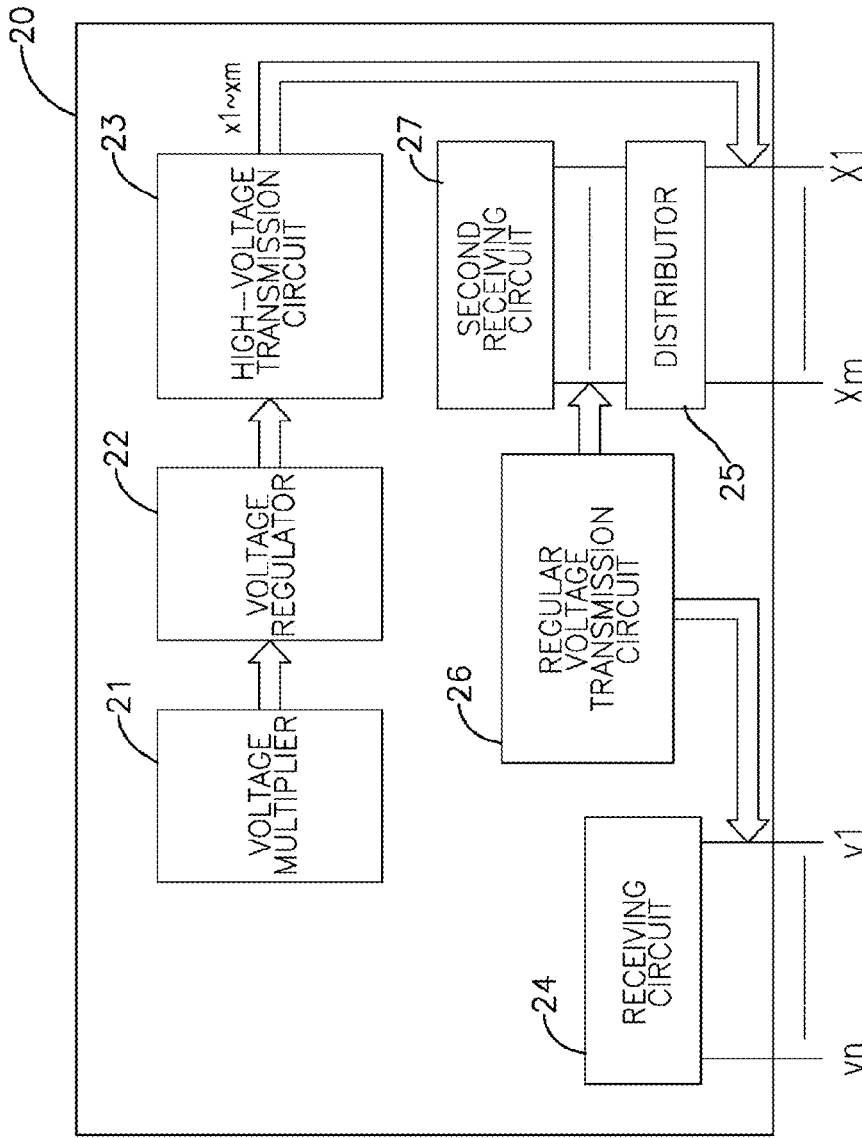
FIG. 7A is a functional block diagram of a fourth embodiment of a driving and detection circuit of the touch panel controller in FIG. 1.

With reference to FIG. 7A, a fourth embodiment of a driving and detection circuit 20 in accordance with the present invention is roughly the same as the first embodiment thereof and has a voltage multiplier 21, a voltage regulator 22, a high-voltage transmission circuit 23, a receiving circuit 24, a distributor 25 and a regular voltage transmission circuit 26. The high-voltage transmission circuit 23 has multiple output terminals x1 to xm. The receiving circuit 24 has multiple input terminals y1 to yn. In the present embodiment, the driving and detection circuit 20 further has a second receiving circuit 27 having multiple input terminals and multiple output terminals. The output terminals are connected to the MCU 40. The input terminals are connected to the distributor 25. The X-axis sensing pins X1 to Xm of the distributor 25 are respectively connected to the output terminals x1 to xm of the high-voltage transmission circuit 23. The output terminals of the regular voltage transmission circuit 26 are respectively connected to the input terminals of the receiving circuit 24 and the second receiving circuit 27.

When the present embodiment is operated, the X-axis sensing pins of the distributor 25 are connected to the respective X-axis traces of the touch panel, and the input terminals of the receiving circuit 24 are connected to the respective Y-axis traces of the touch panel.

While operated under the mutual-capacitance sensing mode, each output terminal x1 to xm of the high-voltage transmission circuit 23 transmits high-voltage driving signals to a corresponding X-axis trace of the touch panel through a corresponding X-axis sensing pin of the distributor 25. Meanwhile, the MCU 40 controls the distributor 25 to block signals transmitted from the second receiving circuit 27, and each input terminal y1 to yn of the receiving circuit 24 receives a sensing signal through a corresponding Y-axis trace of the touch panel.

While operated under the self-capacitance sensing mode, the regular voltage transmission circuit 26 respectively transmits signals having regular voltage to the Y-axis traces and the X-axis traces of the touch panel through the input terminals of the receiving circuit 24 and the second receiving circuit 27 (through the corresponding pins of the distributor 25) and respectively receives the sensing signals of the Y-axis traces and the X-axis traces through the input terminals of the receiving circuit 24 and the second receiving circuit 27.

Figure 7B:
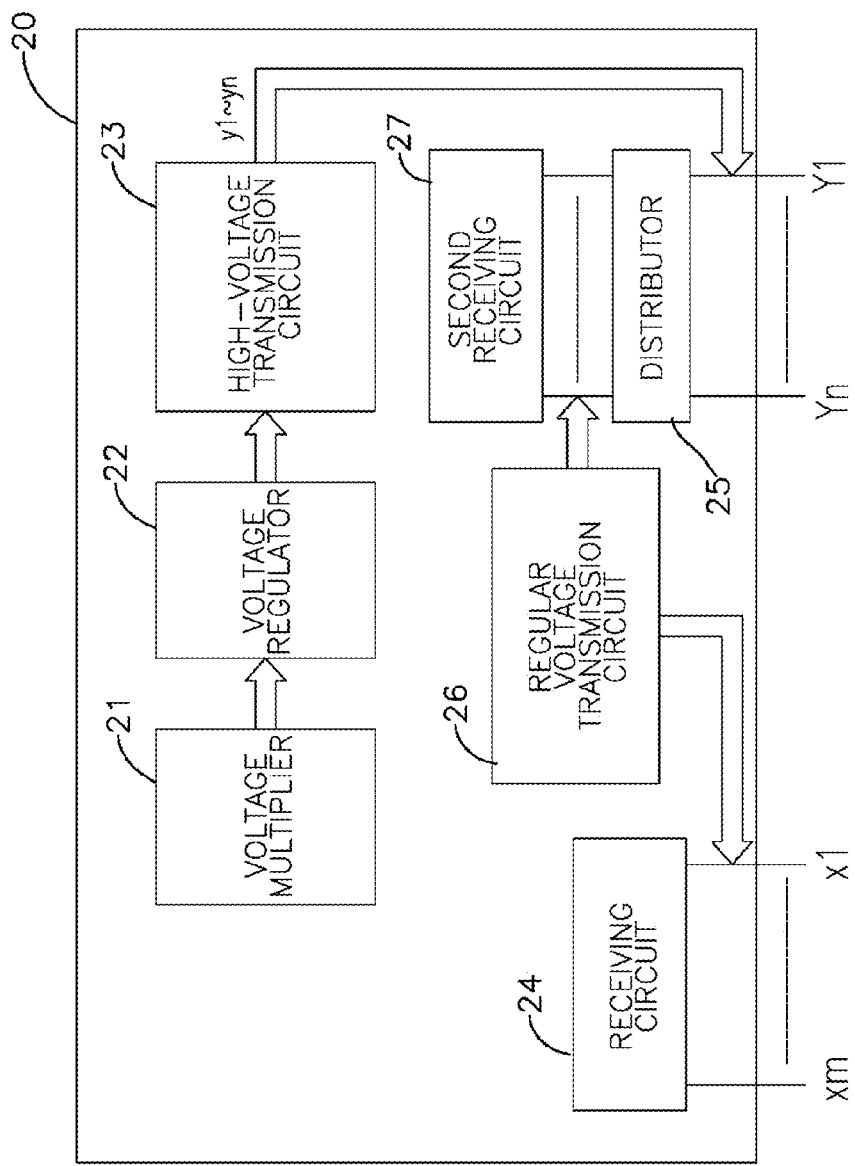
FIG. 7B is a functional block diagram of a fifth embodiment of a driving and detection circuit of the touch panel controller in FIG. 1.

In the present embodiment, the output terminals x1 to xm of the high-voltage transmission circuit 23 are connected to the respective X-axis sensing pins of the distributor 25, and the input terminals y1 to yn of the receiving circuit 24 are connected to the respective Y-axis traces of the touch panel to receive the sensing signals of the Y-axis traces. To those ordinarily skilled in the art, it is understandable that the way of connecting the driving and detection circuit 20 and the X-axis traces and Y-axis traces of the touch panel can be interchanged. With reference to FIG. 7B, the output terminals of the high-voltage transmission circuit 23 are respectively connected to the Y-axis sensing pins Y1 to Yn of the distributor 25, and the output terminals x1 to xm of the receiving circuit 24 are connected to the respective X-axis traces of the touch panel to receive the sensing signals. In other words, while operated under the mutual-capacitance sensing mode, the high-voltage transmission circuit 23 transmits high-voltage driving signals to each Y-axis trace of the touch panel and the receiving circuit 24 receives the sensing signal from each X-axis trace of the touch panel.

Figure 8:
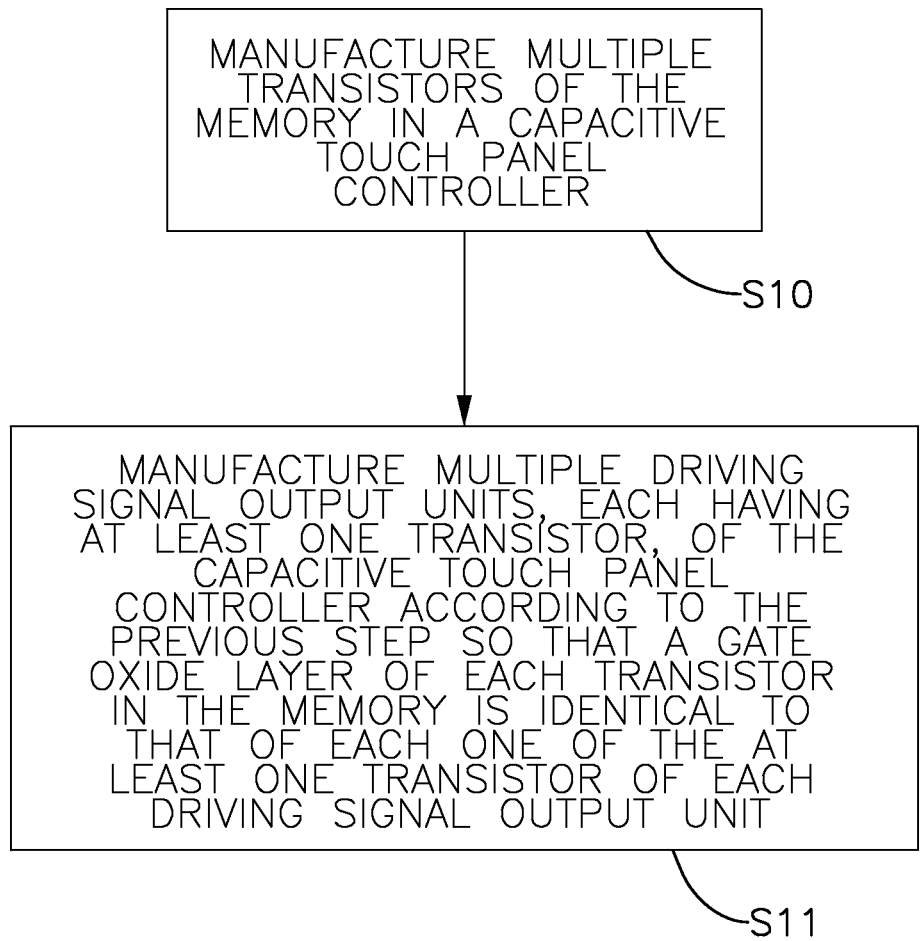
FIG. 8 is a flow diagram of a method manufacturing a touch panel controller having high voltage driving capability in accordance with the present invention.
Figure 9:
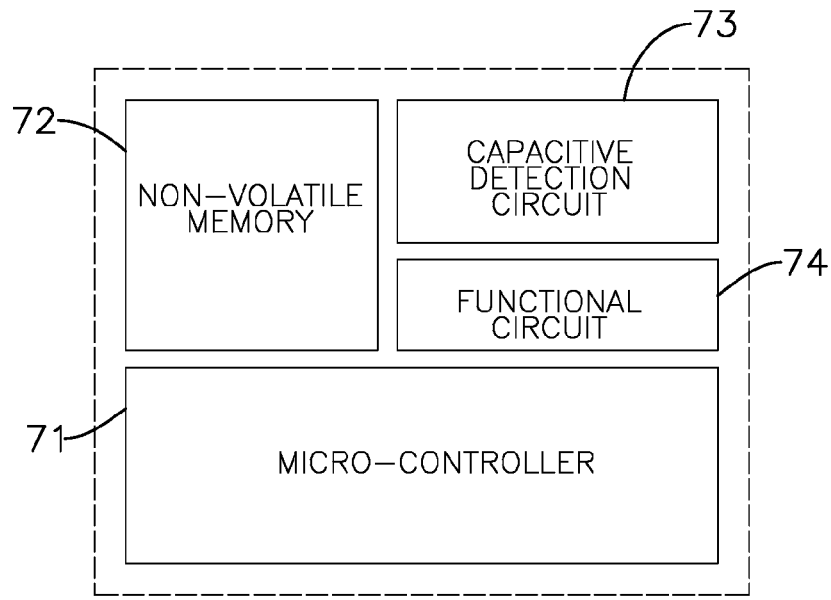
FIG. 9 is a functional block diagram of a conventional capacitive touch panel controller.
Figure 10:
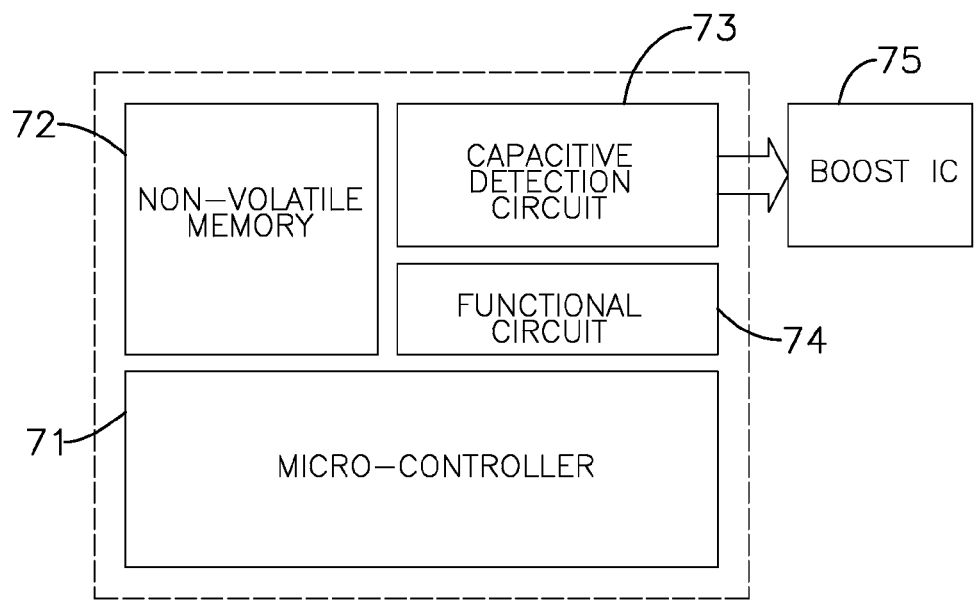
FIG. 10 is a functional block diagram of another conventional capacitive touch panel controller.
Figure 11:
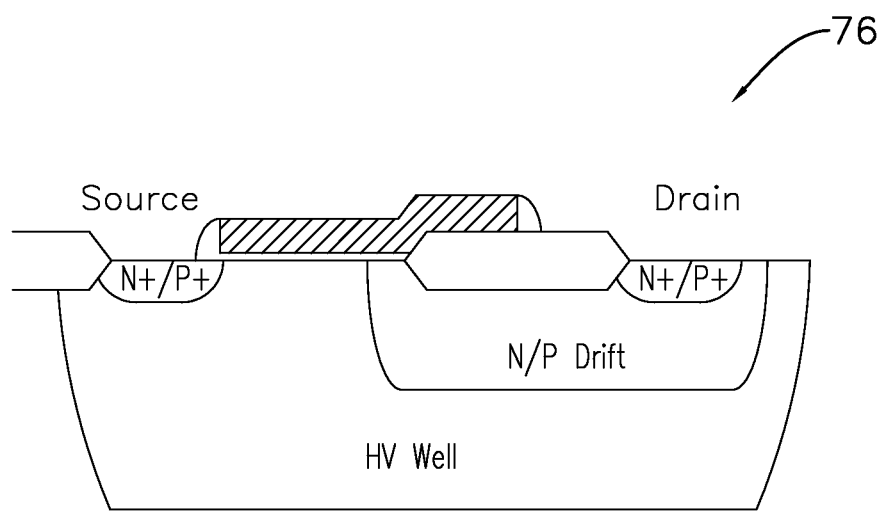
FIG. 11 is a cross-sectional view of a transistor fabricated by a standard high-voltage process.

According to the capacitive touch panel controller, the present invention further provides a method for manufacturing a capacitive touch panel controller. With reference to FIG. 8, a method for manufacturing a capacitive touch panel controller in accordance with the present invention has the following steps.

Step 10: Manufacture multiple transistors of the memory in a capacitive touch panel controller. In the present embodiment, the step may be a fabrication process fabricating a programmable non-volatile memory, such as a 0.18 μm flash memory or an EEPROM.

Step 11: Manufacture multiple driving signal output units, each having at least one transistor, of a high-voltage driving and capacitive detection circuit in the capacitive touch panel controller according to the previous step so that a gate oxide (GDX) layer of the multiple transistors in the memory is identical to that of each one of the at least one transistor of each driving signal output unit as shown in FIGS. 4A and 4B.

For the foregoing capacitive touch panel controller, the driving signal output units of the high-voltage transmission circuit of the driving and detection circuit and the memory can be fabricated in an identical semiconductor fabrication process so that the transistors in the driving signal output units have enhance withstanding capability and reliability against high voltage to become high-voltage transistors. Accordingly, the capacitive touch panel controller of the present invention requires no additional four to seven masking and photo-lithography processes to produce the driving signal output units of the high-voltage transmission circuit, and can produce a capacitive touch panel controller with high-voltage driving capability without using any high-voltage fabrication process and increasing the production cost. As the touch panel can transmit signals with high voltage, the SNR and anti-interference capability of signals inputted to the capacitive touch panel controller can thus be increased.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A capacitive touch sensing device controller comprising:
a micro-controller unit (MCU);
a programmable non-volatile memory connected to the MCU and having multiple first transistors; and
a first circuit connected to the MCU and comprising:
a high-voltage transmission circuit comprising:
multiple driving signal output units, wherein each driving signal output unit is for supplying a driving signal to a capacitive touch sensing device and located outside a voltage multiplier and the programmable non-volatile memory, wherein each driving signal output unit comprises a PMOS transistor and a NMOS transistor connected in series, wherein a source of the PMOS transistor receives a high-voltage and a drain of the PMOS transistor is coupled to a drain of the NMOS transistor and to a corresponding trace connection point for coupling to one of a plurality of traces of the capacitive touch sensing device, wherein a source of the NMOS transistor is connected to ground and a gate of the NMOS transistor is connected to a gate of the PMOS transistor, wherein the PMOS transistor of each driving signal output unit is fabricated by a same fabrication process as the first transistors of the programmable non-volatile memory, and the PMOS transistor of the driving signal output unit located outside the voltage multiplier and the programmable non-volatile memory has a gate oxide layer thickness identical to that of the first transistors of the programmable non-volatile memory.

2. The capacitive touch sensing device controller as claimed in claim 1, wherein the first circuit further comprises:
a receiving circuit comprising:
multiple input terminals, each input terminal adapted to receive a sensing signal from the capacitive touch sensing device; and
at least one output terminal connected to the MCU.

3. The capacitive touch sensing device controller as claimed in claim 2, wherein the PMOS transistor has a gate oxide layer thickness identical to that of the NMOS transistor.

4. The capacitive touch sensing device controller as claimed in claim 3, wherein the first circuit is a high-voltage driving and capacitive detection circuit.

5. The capacitive touch sensing device controller as claimed in claim 4, wherein the high-voltage driving and capacitive detection circuit further comprises:
the voltage multiplier for generating a voltage higher than a normal operating voltage; and
a voltage regulator connected between the voltage multiplier and the high-voltage transmission circuit for regulating the voltage outputted from the voltage multiplier and outputting the regulated voltage to the high-voltage transmission circuit.

6. The capacitive touch sensing device controller as claimed in claim 5, wherein the voltage multiplier is a charge pump comprising:
multiple capacitors;
multiple fourth transistors, each fourth transistor serving to control a phase of a terminal voltage of a corresponding capacitor and fabricated by the same fabrication process as the first transistors of the programmable non-volatile memory, wherein a gate oxide layer thickness of each fourth transistor of the voltage multiplier is identical to that of the PMOS transistor of each driving signal output unit and that of the first transistors of the programmable non-volatile memory; and
an output capacitor.

7. The capacitive touch sensing device controller as claimed in claim 6, wherein the capacitors of the charge pump are external to or built in the charge pump.

8. The capacitive touch sensing device controller as claimed in claim 2, wherein the first circuit further comprises:
a distributor controlled by the MCU, comprising multiple output terminals respectively connected to the multiple input terminals of the receiving circuit, and comprising multiple X-axis sensing contacts and multiple Y-axis sensing contacts, and wherein the output terminals of the high-voltage transmission circuit are respectively connected to the X-axis sensing contacts or the Y-axis sensing contacts of the distributor.

9. The capacitive touch sensing device controller as claimed in claim 3, wherein the first circuit further comprises:

a distributor controlled by the MCU, comprising multiple output terminals respectively connected to the multiple input terminals of the receiving circuit, and comprising multiple X-axis sensing contacts and multiple Y-axis sensing contacts, and wherein the output terminals of the high-voltage transmission circuit are respectively connected to the X-axis sensing contacts or the Y-axis sensing contacts of the distributor.

10. The capacitive touch sensing device controller as claimed in claim 4, wherein the first circuit further comprises:
a distributor controlled by the MCU, having multiple output terminals respectively connected to the multiple input terminals of the receiving circuit, and having multiple X-axis sensing contacts and multiple Y-axis sensing contacts, and wherein the output terminals of the high-voltage transmission circuit are respectively connected to the X-axis sensing contacts or the Y-axis sensing contacts of the distributor.

11. The capacitive touch sensing device controller as claimed in claim 5, wherein the first circuit further comprises:
a distributor controlled by the MCU, comprising multiple output terminals respectively connected to the multiple input terminals of the receiving circuit, and comprising multiple X-axis sensing contacts and multiple Y-axis sensing contacts, and wherein the output terminals of the high-voltage transmission circuit are respectively connected to the X-axis sensing contacts or the Y-axis sensing contacts of the distributor.

12. The capacitive touch sensing device controller as claimed in claim 6, wherein the first circuit further comprises:
a distributor controlled by the MCU, comprising multiple output terminals respectively connected to the multiple input terminals of the receiving circuit, and comprising multiple X-axis sensing contacts and multiple Y-axis sensing contacts, and wherein the output terminals of the high-voltage transmission circuit are respectively connected to the X-axis sensing contacts or the Y-axis sensing contacts of the distributor.

13. The capacitive touch sensing device controller as claimed in claim 7, wherein the first circuit further comprises:
a distributor controlled by the MCU, comprising multiple output terminals respectively connected to the multiple input terminals of the receiving circuit, and comprising multiple X-axis sensing contacts and multiple Y-axis sensing contacts, and wherein the output terminals of the high-voltage transmission circuit are respectively connected to the X-axis sensing contacts or the Y-axis sensing contacts of the distributor.

14. The capacitive touch sensing device controller as claimed in claim 2, wherein the first circuit further comprises:
a distributor controlled by the MCU, comprising multiple output terminals respectively connected to the multiple input terminals of the receiving circuit, and comprising multiple X-axis sensing contacts and multiple Y-axis sensing contacts, and wherein the output terminals of the high-voltage transmission circuit are respectively connected to the X-axis sensing contacts or the Y-axis sensing contacts of the distributor.

15. The capacitive touch sensing device controller as claimed in claim 3, wherein the first circuit further comprises:
a distributor controlled by the MCU, comprising multiple output terminals respectively connected to the multiple input terminals of the receiving circuit, and comprising multiple X-axis sensing contacts and multiple Y-axis sensing contacts, and wherein the output terminals of the high-voltage transmission circuit are respectively connected to the X-axis sensing contacts or the Y-axis sensing contacts of the distributor.

16. The capacitive touch sensing device controller as claimed in claim 4, wherein the first circuit further comprises:
a distributor controlled by the MCU, comprising multiple output terminals respectively connected to the multiple input terminals of the receiving circuit, and comprising multiple X-axis sensing contacts and multiple Y-axis sensing contacts, and wherein the output terminals of the high-voltage transmission circuit are respectively connected to the X-axis sensing contacts or the Y-axis sensing contacts of the distributor.

17. The capacitive touch sensing device controller as claimed in claim 5, wherein the first circuit further comprises:
a distributor controlled by the MCU, comprising multiple output terminals respectively connected to the multiple input terminals of the receiving circuit, and comprising multiple X-axis sensing contacts and multiple Y-axis sensing contacts, and wherein the output terminals of the high-voltage transmission circuit are respectively connected to the X-axis sensing contacts or the Y-axis sensing contacts of the distributor.

18. The capacitive touch sensing device controller as claimed in claim 6, wherein the first circuit further comprises:
a distributor controlled by the MCU, comprising multiple output terminals respectively connected to the multiple input terminals of the receiving circuit, and comprising multiple X-axis sensing contacts and multiple Y-axis sensing contacts, and wherein the output terminals of the high-voltage transmission circuit are respectively connected to the X-axis sensing contacts or the Y-axis sensing contacts of the distributor.

19. The capacitive touch sensing device controller as claimed in claim 7, wherein the first circuit further comprises:
a distributor controlled by the MCU, comprising multiple output terminals respectively connected to the multiple input terminals of the receiving circuit, and comprising multiple X-axis sensing contacts and multiple Y-axis sensing contacts, and wherein the output terminals of the high-voltage transmission circuit are respectively connected to the X-axis sensing contacts or the Y-axis sensing contacts of the distributor.

20. The capacitive touch sensing device controller as claimed in claim 8, wherein the first circuit further comprises a regular voltage transmission circuit comprising an output terminal connected to each input terminal of the receiving circuit.

21. The capacitive touch sensing device controller as claimed in claim 9, wherein the first circuit further comprises a regular voltage transmission circuit comprising an output terminal connected to each input terminal of the receiving circuit.

22. The capacitive touch sensing device controller as claimed in claim 10, wherein the first circuit further comprises a regular voltage transmission circuit comprising an output terminal connected to each input terminal of the receiving circuit.

23. The capacitive touch sensing device controller as claimed in claim 11, wherein the first circuit further comprises a regular voltage transmission circuit comprising an output terminal connected to each input terminal of the receiving circuit.

24. The capacitive touch sensing device controller as claimed in claim 12, wherein the first circuit further comprises a regular voltage transmission circuit comprising an output terminal connected to each input terminal of the receiving circuit.

25. The capacitive touch sensing device controller as claimed in claim 13, wherein the first circuit further comprises a regular voltage transmission circuit comprising an output terminal connected to each input terminal of the receiving circuit.

26. The capacitive touch sensing device controller as claimed in claim 14, wherein the first circuit further comprises a regular voltage transmission circuit comprising an output terminal connected to each input terminal of the receiving circuit.

27. The capacitive touch sensing device controller as claimed in claim 15, wherein the first circuit further comprises a regular voltage transmission circuit comprising an output terminal connected to each input terminal of the receiving circuit.

28. The capacitive touch sensing device controller as claimed in claim 16, wherein the first circuit further comprises a regular voltage transmission circuit comprising an output terminal connected to each input terminal of the receiving circuit.

29. The capacitive touch sensing device controller as claimed in claim 17, wherein the first circuit further comprises a regular voltage transmission circuit comprising an output terminal connected to each input terminal of the receiving circuit.

30. The capacitive touch sensing device controller as claimed in claim 18, wherein the first circuit further comprises a regular voltage transmission circuit comprising an output terminal connected to each input terminal of the receiving circuit.

31. The capacitive touch sensing device controller as claimed in claim 19, wherein the first circuit further comprises a regular voltage transmission circuit comprising an output terminal connected to each input terminal of the receiving circuit.

32. The capacitive touch sensing device controller as claimed in claim 2, wherein the first circuit further comprises:
   a distributor controlled by the MCU and comprising multiple X-axis sensing contacts and multiple Y-axis sensing contacts respectively connected to the output terminals of the high-voltage transmission circuit; and
   a second receiving circuit controlled by the MCU and comprising:
      multiple input terminals connected to the distributor; and
      multiple output terminals connected to the MCU.

33. The capacitive touch sensing device controller as claimed in claim 3, wherein the first circuit further comprises:
   a distributor controlled by the MCU and comprising multiple X-axis sensing contacts and multiple Y-axis sensing contacts respectively connected to the output terminals of the high-voltage transmission circuit; and
   a second receiving circuit controlled by the MCU and comprising:
      multiple input terminals connected to the distributor; and
      multiple output terminals connected to the MCU.

34. The capacitive touch sensing device controller as claimed in claim 4, wherein the first circuit further comprises:
   a distributor controlled by the MCU and comprising multiple X-axis sensing contacts and multiple Y-axis sensing contacts respectively connected to the output terminals of the high-voltage transmission circuit; and
   a second receiving circuit controlled by the MCU and comprising:
      multiple input terminals connected to the distributor; and
      multiple output terminals connected to the MCU.

35. The capacitive touch sensing device controller as claimed in claim 5, wherein the first circuit further comprises:
   a distributor controlled by the MCU and comprising multiple X-axis sensing contacts and multiple Y-axis sensing contacts respectively connected to the output terminals of the high-voltage transmission circuit; and
   a second receiving circuit controlled by the MCU and comprising:
      multiple input terminals connected to the distributor; and
      multiple output terminals connected to the MCU.

36. The capacitive touch sensing device controller as claimed in claim 6, wherein the first circuit further comprises:
   a distributor controlled by the MCU and comprising multiple X-axis sensing contacts and multiple Y-axis sensing contacts respectively connected to the output terminals of the high-voltage transmission circuit; and
   a second receiving circuit controlled by the MCU and comprising:
      multiple input terminals connected to the distributor; and
      multiple output terminals connected to the MCU.

37. The capacitive touch sensing device controller as claimed in claim 7, wherein the first circuit further comprises:
   a distributor controlled by the MCU and comprising multiple X-axis sensing contacts and multiple Y-axis sensing contacts respectively connected to the output terminals of the high-voltage transmission circuit; and
   a second receiving circuit controlled by the MCU and comprising:
      multiple input terminals connected to the distributor; and
      multiple output terminals connected to the MCU.

38. The capacitive touch sensing device controller as claimed in claim 32, wherein the first circuit further comprises a regular voltage transmission circuit comprising a output terminal connected to each input terminal of the receiving circuit and the second receiving circuit.

39. The capacitive touch sensing device controller as claimed in claim 33, wherein the first circuit further comprises a regular voltage transmission circuit comprising a output terminal connected to each input terminal of the receiving circuit and the second receiving circuit.

40. The capacitive touch sensing device controller as claimed in claim 34, wherein the first circuit further comprises a regular voltage transmission circuit comprising a output terminal connected to each input terminal of the receiving circuit and the second receiving circuit.

41. The capacitive touch sensing device controller as claimed in claim 35, wherein the first circuit further comprises a regular voltage transmission circuit comprising a output terminal connected to each input terminal of the receiving circuit and the second receiving circuit.

42. The capacitive touch sensing device controller as claimed in claim 36, wherein the first circuit further comprises a regular voltage transmission circuit comprising a output terminal connected to each input terminal of the receiving circuit and the second receiving circuit.

43. The capacitive touch sensing device controller as claimed in claim 37, wherein the first circuit further comprises a regular voltage transmission circuit comprising a output terminal connected to each input terminal of the receiving circuit and the second receiving circuit.

44. A method for manufacturing a capacitive touch sensing device controller comprising steps of:

manufacturing multiple transistors of a programmable non-volatile memory in a capacitive touch panel controller using a programmable non-volatile memory fabrication process; and manufacturing a PMOS transistor of a driving signal output unit using the programmable non-volatile memory fabrication process, wherein the driving signal output unit is for supplying a driving signal to a capacitive touch sensing device, wherein the driving signal output unit comprises the PMOS transistor and a NMOS transistor connected in series, wherein a source of the PMOS transistor receives a high-voltage and a drain of the PMOS transistor is coupled to a drain of the NMOS transistor and to a trace connection point for coupling to one of a plurality of traces of the capacitive touch sensing device, wherein a source of the NMOS transistor is connected to ground and a gate of the NMOS transistor is connected to a gate of the PMOS transistor, wherein a gate oxide layer thickness of the multiple transistors in the programmable non-volatile memory is identical to that of the PMOS transistor in the driving signal output unit;

wherein the PMOS transistor of the driving signal output unit is located outside a voltage multiplier and the programmable non-volatile memory.

45. The method as claimed in claim 44, further comprising:
manufacturing a high voltage transistor of the voltage multiplier using the programmable non-volatile memory fabrication process, wherein the voltage multiplier supplies a high voltage to the driving signal output unit.

46. The method as claimed in claim 44, wherein the programmable non-volatile memory fabrication process is used to manufacture a flash memory or an electrically-erasable programmable read only memory (EEPROM).

47. The method as claimed in claim 45, wherein the programmable non-volatile memory fabrication process is used to manufacture a flash memory or an EEPROM.

48. A capacitive touch sensing device controller having high-voltage driving capability comprising:
a memory comprising multiple transistors; and
a driving signal output unit for supplying a driving signal to a capacitive touch sensing device, wherein the driving signal output unit comprises a PMOS transistor and a NMOS transistor connected in series, wherein a source of the PMOS transistor receives a high-voltage and a drain of the PMOS transistor is coupled to a drain of the NMOS transistor and to a corresponding trace connection point for coupling to one of a plurality of traces of the capacitive touch sensing device, wherein a source of the NMOS transistor is connected to ground and a gate of the NMOS transistor is connected to a gate of the PMOS transistor, the driving signal output unit being located outside a voltage multiplier and the memory, the PMOS transistor having a gate oxide layer thickness identical to that of the multiple transistors of the memory.

49. The capacitive touch sensing device controller having high-voltage driving capability as claimed in claim 48, wherein the driving signal output unit is an inverter.

50. The capacitive touch sensing device controller having high-voltage driving capability as claimed in claim 49, wherein the PMOS transistor is manufactured by a same semiconductor fabrication process as a flash memory or an EEPROM.

51. The capacitive touch sensing device controller having high-voltage driving capability as claimed in claim 49, further comprising the voltage multiplier for supplying a high voltage to the driving signal output unit.

\* \* \* \* \*